(12) United States Patent
Chiu et al.

(10) Patent No.: US 9,047,060 B2
(45) Date of Patent: Jun. 2, 2015

(54) HEATING ELEMENT AND CIRCUIT MODULE STACK STRUCTURE

(71) Applicant: Adlink Technology Inc., New Taipei (TW)

(72) Inventors: Fang-Yu Chiu, New Taipei (TW); Chun-Hung Chou, New Taipei (TW)

(73) Assignee: Adlink Technology Inc., New Taipei (TW)

( * ) Notice: Subject to any disclaimer, the term of this patent is extended or adjusted under 35 U.S.C. 154(b) by 139 days.

(21) Appl. No.: 13/969,019

(22) Filed: Aug. 16, 2013

(65) Prior Publication Data

US 2015/0048073 A1 Feb. 19, 2015

(51) Int. Cl.
| H05B 1/00 | (2006.01) |
| H05B 3/00 | (2006.01) |
| H05B 11/00 | (2006.01) |
| H05B 1/02 | (2006.01) |
| H05B 3/06 | (2006.01) |
| H05B 3/50 | (2006.01) |
| G06F 1/18 | (2006.01) |
| H01L 23/34 | (2006.01) |

(52) U.S. Cl.
CPC ............. *G06F 1/18* (2013.01); *H01L 23/345* (2013.01)

(58) Field of Classification Search
CPC .......... G06F 1/18; H01L 23/345; H05B 1/02; H05B 3/22; H05B 3/26; H05B 3/262; H05B 3/265; H05B 3/267; H05K 1/0212; H05K 2203/1115

USPC ................. 219/209, 494, 520, 521, 530, 540
See application file for complete search history.

(56) References Cited

U.S. PATENT DOCUMENTS

| 5,055,914 | A | * | 10/1991 | Shimizu et al. | ............... 257/722 |
| 5,365,402 | A | * | 11/1994 | Hatada et al. | ................. 361/699 |
| 5,566,052 | A | * | 10/1996 | Hughes | ......................... 361/704 |
| 5,569,950 | A | * | 10/1996 | Lewis et al. | .................... 257/467 |
| 6,219,239 | B1 | * | 4/2001 | Mellberg et al. | ............. 361/704 |
| 6,862,405 | B2 | * | 3/2005 | Malinoski et al. | ............ 392/479 |
| 2004/0036492 | A1 | * | 2/2004 | Gaasch et al. | ................ 324/760 |
| 2011/0122584 | A1 | * | 5/2011 | Hata | ............................. 361/700 |
| 2013/0083488 | A1 | * | 4/2013 | Watanabe et al. | ............. 361/719 |

\* cited by examiner

*Primary Examiner* — Dana Ross
*Assistant Examiner* — Lindsey C Teaters
(74) *Attorney, Agent, or Firm* — Muncy, Geissler, Olds & Lowe, P.C.

(57) ABSTRACT

A heating element and circuit module stack structure includes a circuit module carrying a chip unit, a heat sink having a flat bottom block protruded from a thermally conductive base member and in contact with the chip unit, a heat transfer layer set between the thermally conductive base member and the chip unit around the flat bottom block, an electric heating element mounted in between the heat transfer layer and the thermally conductive base member around the flat bottom block for heating the chip unit, and a thermal insulation component isolating the thermally conductive base member from the electric heating element. The circuit module turns on the electrical heating element when the temperature of the chip unit drops blow 0° C., and turns off the electrical heating element when the temperature reaches the normal operating temperature range, enabling the computer to be used in a low temperature or cold outdoor environment.

14 Claims, 8 Drawing Sheets

HEATING ELEMENT AND CIRCUIT MODULE STACK STRUCTURE

BACKGROUND OF THE INVENTION

1. Field of the Invention

The present invention relates to circuit module heating technology, and more particularly to a heating element and circuit module stack structure that automatically turns on an electrical heating element to heat the chip unit of the circuit module when the temperature of the chip unit drops below 0° C. under a cold weather environment, and automatically turns off the electrical heating element when the temperature reaches a predetermined normal operating temperature range.

2. Description of the Related Art

Following fast development of computer electronic technology, desk computers, notebook computers, and other related products with high power, high operation speed, large capacity and low profile characteristics have been continuously created. However, during operation of a computer, the CPU, graphic processor and other components of the computer will release waste heat. An electronic component having a relatively higher operation speed can generate a relatively larger amount of waste heat. It is important to provide a computer with a heat dissipation structure, enabling the CPU or other electronic components to work within the normal operating temperature range.

Further, heat sinks are commonly used in computers and kept in close contact with chips (CPU, graphic processor, etc.) for quick dissipation of waste heat. An electric fan may be attached to a heat sink to enhance dissipation of heat. Using a chip unit at a circuit board under a normal room temperature environment simply needs to consider the problem of overheat due to a high operation speed. However, using a computer under a severe weather condition where the temperature and moisture changes in an extremely wide range, or in a desert, snow place or any other place where there is a large temperature difference between day and night or the weather is extremely cold, the computer may be unable to start up the CPU.

A computer system may be used in a severe weather environment. Therefore, a computer system can be configured to work under the temperature range of −40° C.~++80° C. However, because the normal operating temperature range of computer electronic components (either active or passive components) is set in the range of 0° C.~++75° C., the internal temperature of the computer must be kept within this normal operating temperature range if the computer is used in a cold outdoor environment under 0° C. For allowing a computer to be used in a severe cold weather environment, the computer may be wrapped or stuffed with heat insulating materials to protect internal electronic components against outside cold air. However, because it is the market trend to create computers having light, thin, short and small characteristics, wrapping or stuffing a computer with heat insulating materials cannot meet this computer design requirements. Further, because a computer has many connectors and buttons, the use of heat insulating materials cannot fully protect the computer internal components against outside cold air.

In order to eliminate the drawbacks of the use of heat insulating materials in a computer, an electrical heating device may be installed in a circuit board in a computer to be used under a severe weather environment. An electrical heating device for this purpose is known comprising a heating layer, a DC power source, and a current regulator. The heating layer is set in between insulating layers in the circuit board, comprising a heating circuit having a predetermined resistance and prepared from an electrically conductive material. The DC power source is adapted to provide direct current to the heating circuit of the heating layer. The current regulator is adapted to regulate the volume of the current at the heating circuit. When the heating circuit of the heating layer is electrically conducted, it generates heat that is then transferred by a metal circuit layer of the circuit board to the electronic components at the metal circuit layer to heat the electronic components to the normal operating temperature range. However, because the circuit board carries a large amount of electronic components that are densely installed in the circuit board, it is complicated to install the heating layer in the insulating layers and metal circuit layer of the circuit board, leading to increase in manufacturing cost.

Further, a circuit board manufacture may install a heating module in the circuit board. The heating module comprises a metal-oxide-semiconductor field-effect transistors (MOSFETs), a DC power source, a current sensor, and a dynamic resistance controller. The MOSFETs are mounted at the surface of the circuit board. The DC power source is adapted to provide a DC voltage to the MOSFETs. The dynamic resistance controller is adapted to regulate the on-state resistance of the MOSFETs subject to the intensity of the DC current detected by the current sensor, keeping the MOSFETs in the critical state between on and off state to continuously generate heat. The heat generated by the MOSFETs is dissipated to the surrounding area around the electronic components at the circuit board, keeping the electronic components in the normal operating temperature range. However, the installation of the MOSFETs complicates the spatial arrangement of the circuit board. In the circuit board, the electronic components at the circuit board that are disposed close to the MOSFETs receive better heating effects, however, the electronic components at the circuit board that are disposed far from the MOSFETs cannot receive optimal heating effects. Further, the use of the MOSFETs and the dynamic resistance controller greatly increases the cost of the heating module. An improvement in this regard is desired.

SUMMARY OF THE INVENTION

The present invention has been accomplished under the circumstances in view. It is one object of the present invention to provide a heating element and circuit module stack structure, which automatically turns on an electrical heating element to heat the chip unit of the circuit module when the temperature drops below 0° C., and automatically turns off the electrically heating element when the temperature reaches a predetermined normal operating temperature range, enabling the computer providing the heating element and circuit module stack structure to be used in a low temperature or cold outdoor environment.

To achieve this and other objects of the present invention, a heating element and circuit module stack structure comprises a circuit module carrying a chip unit, a heat sink having a flat bottom block protruded from a thermally conductive base member thereof and kept in close contact with the chip unit, a heat transfer layer set between the thermally conductive base member and the chip unit around the flat bottom block, an electric heating element mounted in between the heat transfer layer and the thermally conductive base member around the flat bottom block for heating the chip unit, and a thermal insulation component set between the electric heating element and the thermally conductive base member around the flat bottom block. When the temperature of the chip unit drops blow 0° C., the circuit module drives the electrical heating element to generate heat for heating the chip unit through the heat transfer layer. When the temperature of the chip unit reaches the normal operating temperature range, the circuit module turns off the electrical heating element. Thus, the computer providing the heating element and circuit module stack structure can be used in a low temperature or cold outdoor environment.

Further, the thermal insulation component effectively isolates the electric heating element from the thermally conductive base member of the heat sink, avoiding interfering with the functioning of the stack structure to heat the chip unit to the optimal operating condition. Thus, the heating element and circuit module stack structure effectively solves the wrapping problem and the problem of limited temperature-maintaining effects of using heat insulating materials, and effectively eliminates the drawbacks of using a resistance heating circuit or wide temperature components that are complicated and expensive to manufacture and their installation can affect the circuit layout. The application of the heating element and circuit module stack structure facilitates spatial arrangement and achieves optimal chip unit heating effects.

DETAILED DESCRIPTION OF THE PREFERRED EMBODIMENT

Figure 1:
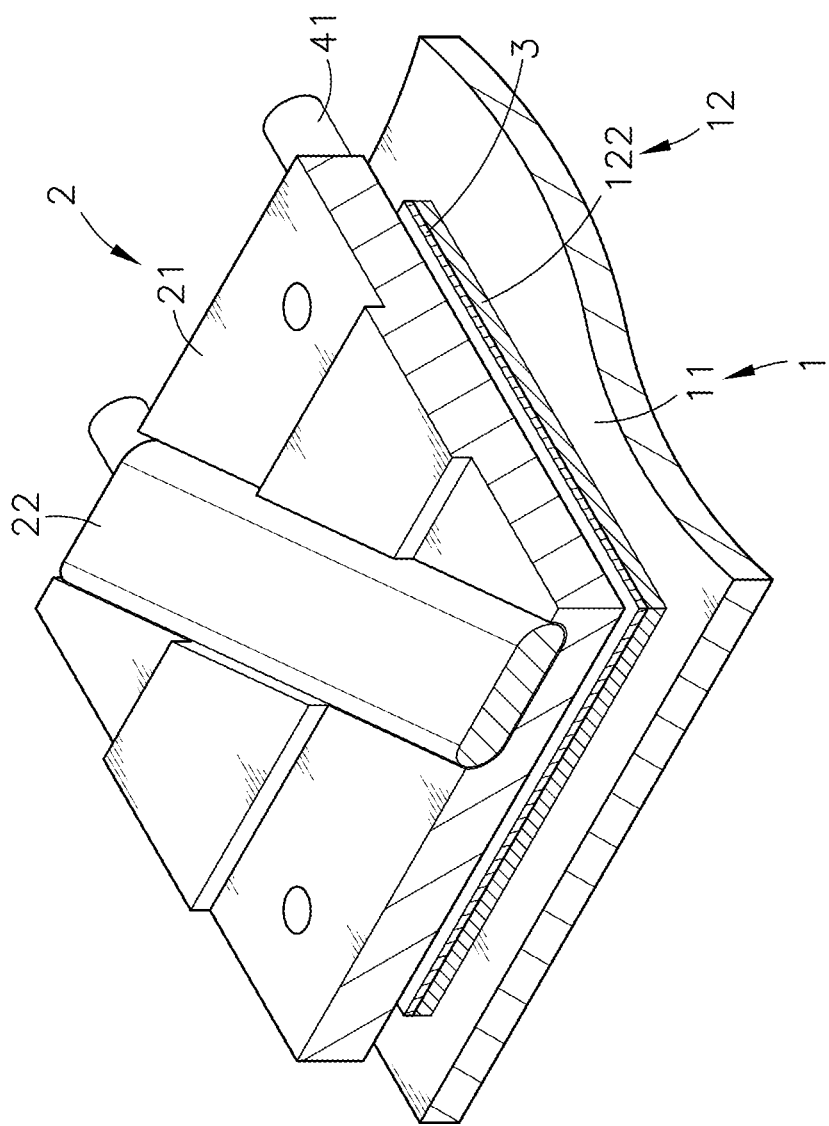
FIG. 1 is an oblique top elevation of a heating element and circuit module stack structure in accordance with a first embodiment of the present invention.
Figure 2:
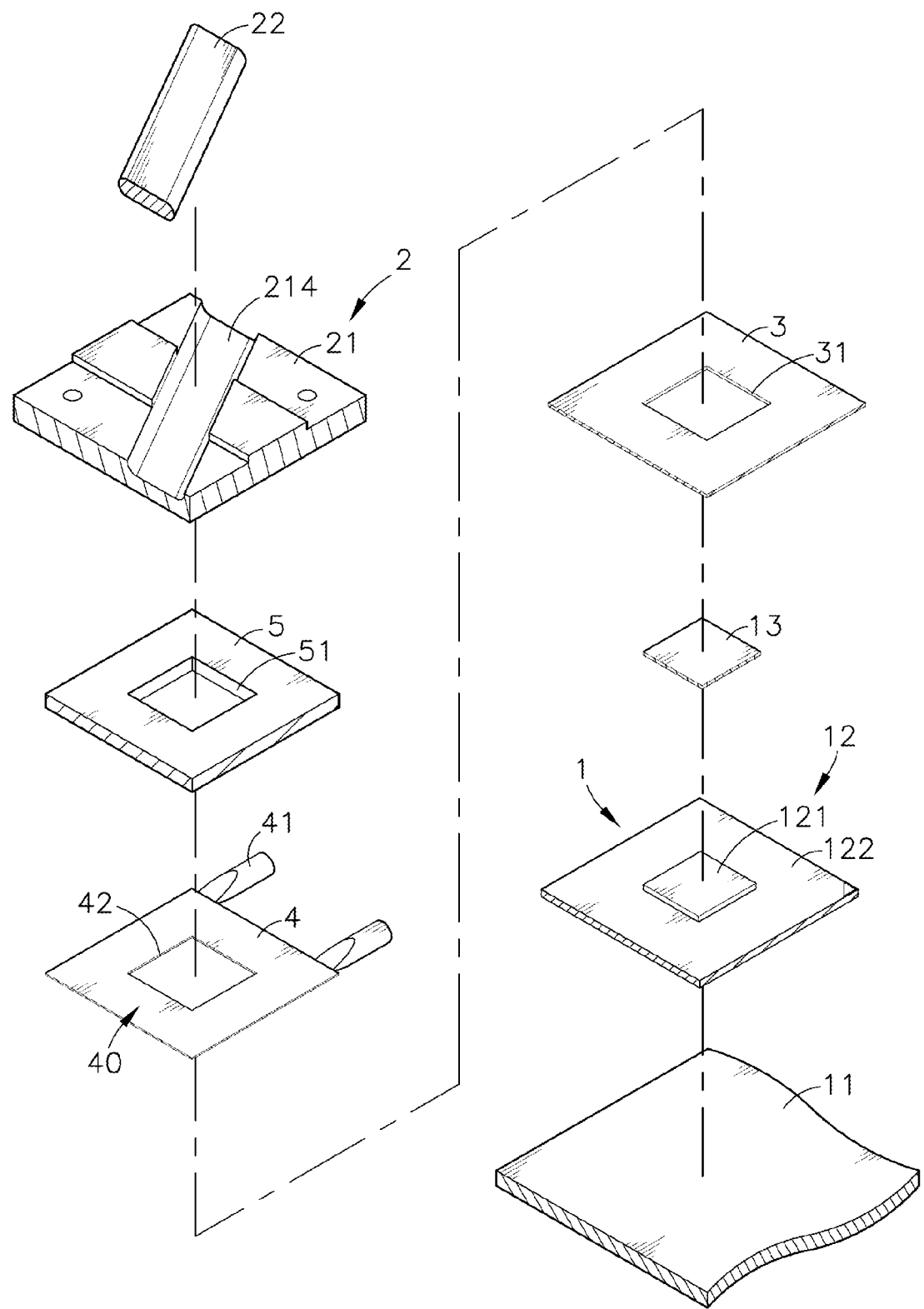
FIG. 2 is an exploded view of the heating element and circuit module stack structure in accordance with the first embodiment of the present invention.
Figure 3:
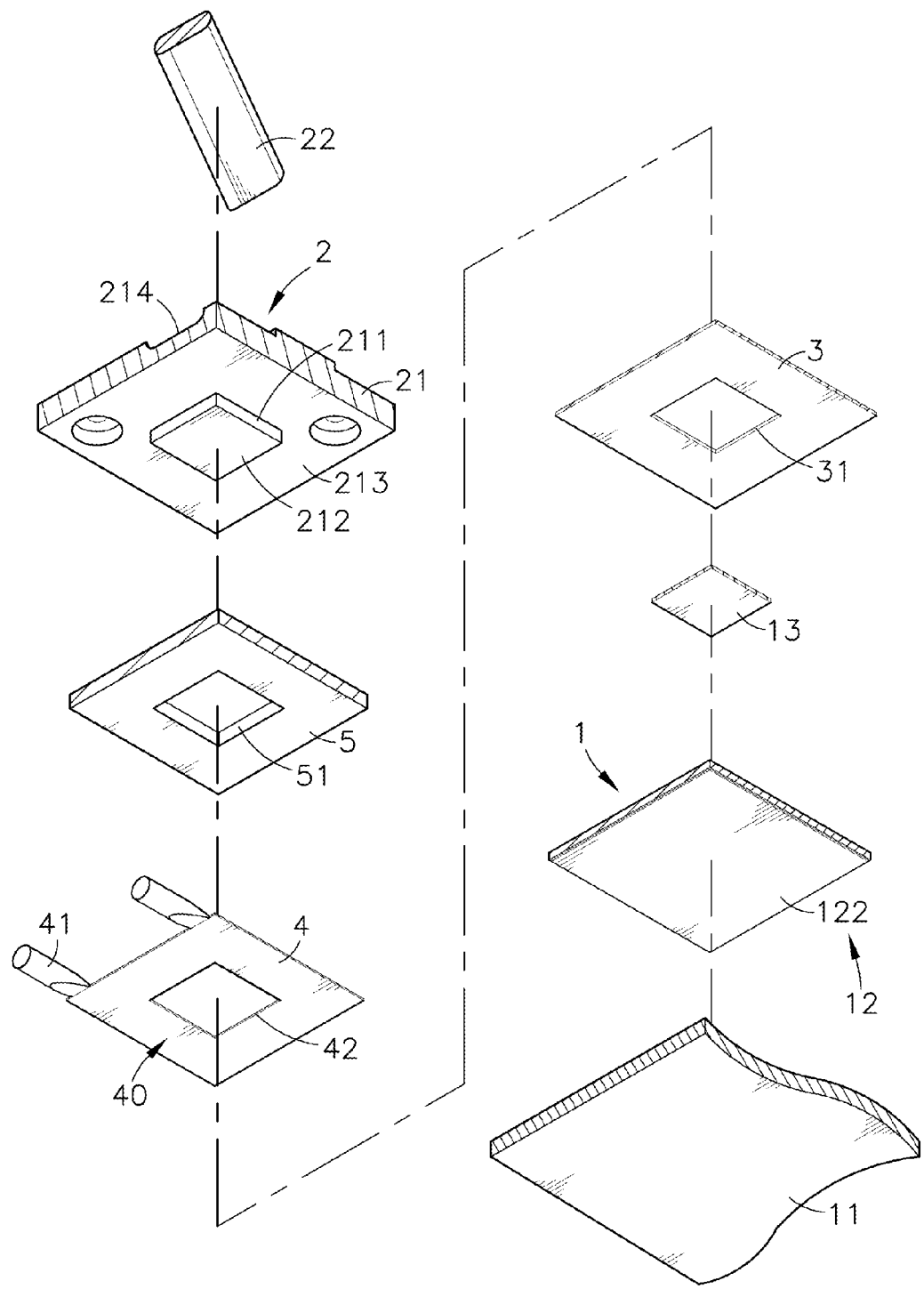
FIG. 3 corresponds to FIG. 2 when viewed from another angle.

Referring to FIGS. 1-4, a heating element and circuit module stack structure in accordance with a first embodiment of the present invention is shown. As illustrated, the heating element and circuit module stack structure comprises a circuit module 1, a heat sink 2, a heat transfer layer 3, an electric heating element 4, and a thermal insulation component 5.

The circuit module 1 comprises a circuit board 11, and a chip unit 12 mounted at the top side of the circuit board 11. The chip unit 12 has its one side bonded to the circuit board 11, and its other side kept in close contact with a thermally conductive base member 21 of the heat sink 2. The thermally conductive base member 21 of the heat sink 2 has a bottom wall 213, and a flat bottom block 211 protruded from a center area of the bottom wall 213 and kept in close contact with the chip unit 12. The heat transfer layer 3 is mounted in between the bottom wall 213 of the thermally conductive base member 21 of the heat sink 2 and the chip unit 12 around the flat bottom block 211. The electric heating element 4 is mounted in between the heat transfer layer 3 and the bottom wall 213 of the thermally conductive base member 21 of the heat sink 2 around the flat bottom block 211. The thermal insulation component 5 is mounted in between the electric heating element 4 and the bottom wall 213 of the thermally conductive base member 21 of the heat sink 2 around the flat bottom block 211.

Further, the chip unit 12 of the circuit module 1 can be, for example, a CPU, comprising a chip 121 and a carrier plate 122. The chip 121 can be directly and electrically bonded to the carrier plate 122, or through a lead frame (not shown). After the chip 121 and the carrier plate 122 are bonded together, they are resin-encapsulated. The thermally conductive base member 21 of the heat sink 2 is a flat member. The flat bottom block 211 of the thermally conductive base member 21 has a planar contact surface 212 kept in close contact with the chip unit 12. The bottom wall 213 of the thermally conductive base member 21 of the heat sink 2 is a planar wall kept in close contact with the thermal insulation component 5. The heat sink 2 further comprises a heat pipe 22 accommodated in a locating groove 214 at the top wall of the thermally conductive base member 21 opposite to the thermal insulation component 5. Alternatively, the heat sink 2 can be configured without the thermal insulation component 5. For example, the heat sink 2 can be configured having a plurality of radiation fins (not shown) vertically arranged at the top wall of the thermally conductive base member 21, and an electric fan (not shown) mounted at the radiation fins for dissipating waste heat from the chip unit 12 of the circuit module 1.

The chip unit 12 further comprises a heat transfer medium 13 set between the planar contact surface 212 of the flat bottom block 211 of the thermally conductive base member 21 and the chip 121. The heat transfer medium 13 can be a thermal adhesive, or a thin thermal gap filler pad. The heat transfer layer 3 can be a thermal pad made from silicone, rubber, ceramic or any other thermal conductive material, and mounted in between the bottom wall 213 of the thermally conductive base member 21 of the heat sink 2 and the chip unit 12 around the flat bottom block 211, having a center opening 31 for accommodating the chip 121 of the chip unit 12 of the circuit module 1. The electric heating element 4 is a flexible thin-sheet electric heating element mounted in between the heat transfer layer 3 and the bottom wall 213 of the thermally conductive base member 21 of the heat sink 2 around the flat bottom block 211, comprising a heat generating area 40, an opening 42 cut through the heat generating area 40 for accommodating the chip 121 of the chip unit 12 of the circuit module 1, and a plurality of power lead wires 41 electrically connecting the heat generating area 40 to the power circuit or power supply device (not shown) of the circuit board 11 of the circuit module 1. Different commercially available designs of electric heating element 4 can be selectively used. With respect to the preparation of the heat generating area 40 and its operation to generate heat upon conduction of electricity through the power lead wires, these features are of the known art and not within the scope of the technical features of the present invention, and therefore no further detailed description in this regard is given.

Further, the thermal insulation component 5 can be made from silicone, polyethylene terephthalate (Mylar®), sponge, glass fire, carbon fiber, Mica sheet or aluminum oxide ceramic, or most preferably, rubber. These materials have excellent high temperature resistant and electrical insulating properties. Further, the thermal insulation component 5 has an opening 51 for the perforation of the flat bottom block 211 of the thermally conductive base member 21 to let the planar bottom surface 212 of the flat bottom block 211 be flexibly kept in close contact with the chip 121 of the chip unit 12 of the circuit module 1. Thus, the thermal insulation component 5 effectively isolates the heat generating area 40 of the electric heating element 4 from the bottom wall 213 of the thermally conductive base member 21 of the heat sink 2, avoiding interfering with the functioning of the stack structure to heat the chip unit 12 to the optimal operating condition.

Figure 5:
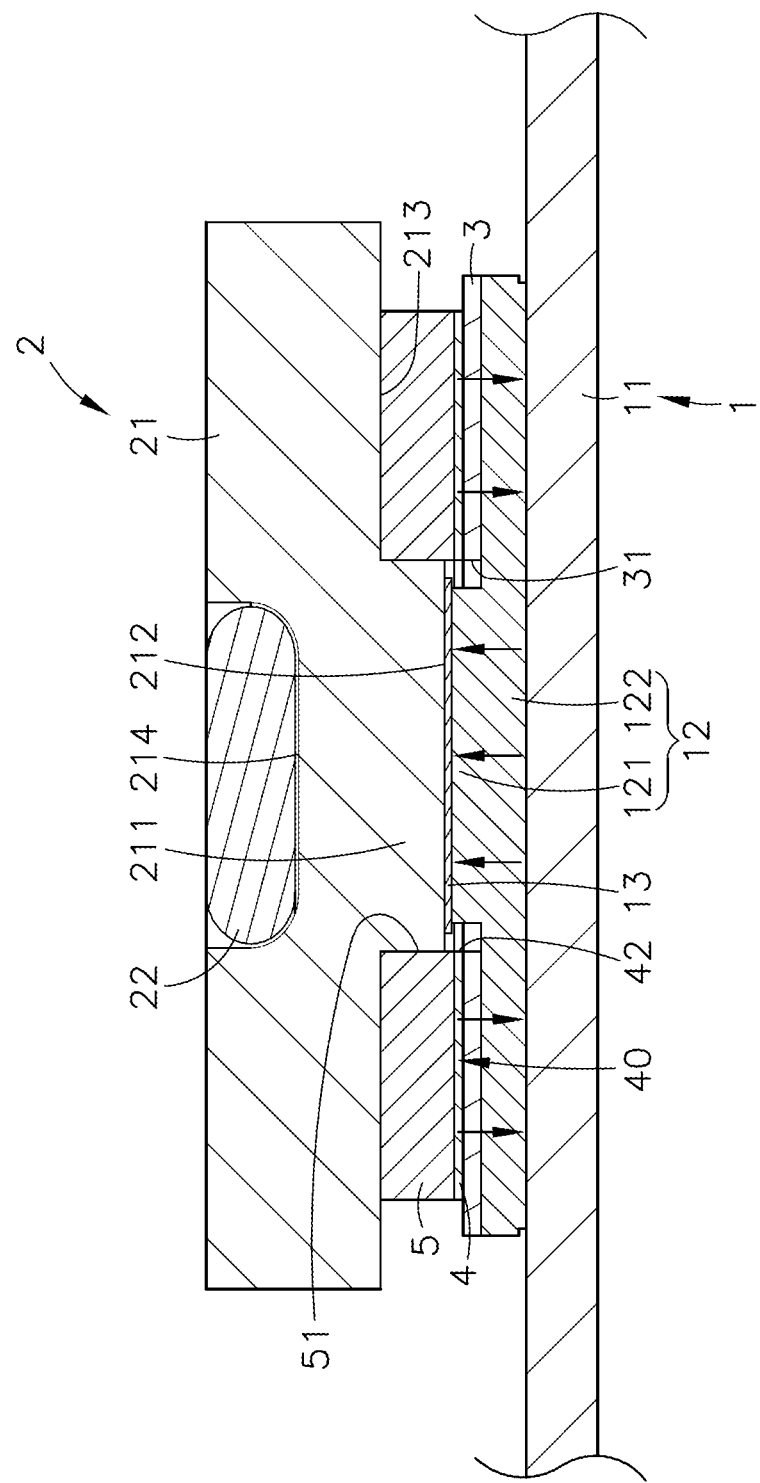
FIG. 5 is a schematic applied view of the first embodiment of the present invention, illustrating a heating operation status of the heating element and circuit module stack structure.
Figure 6:
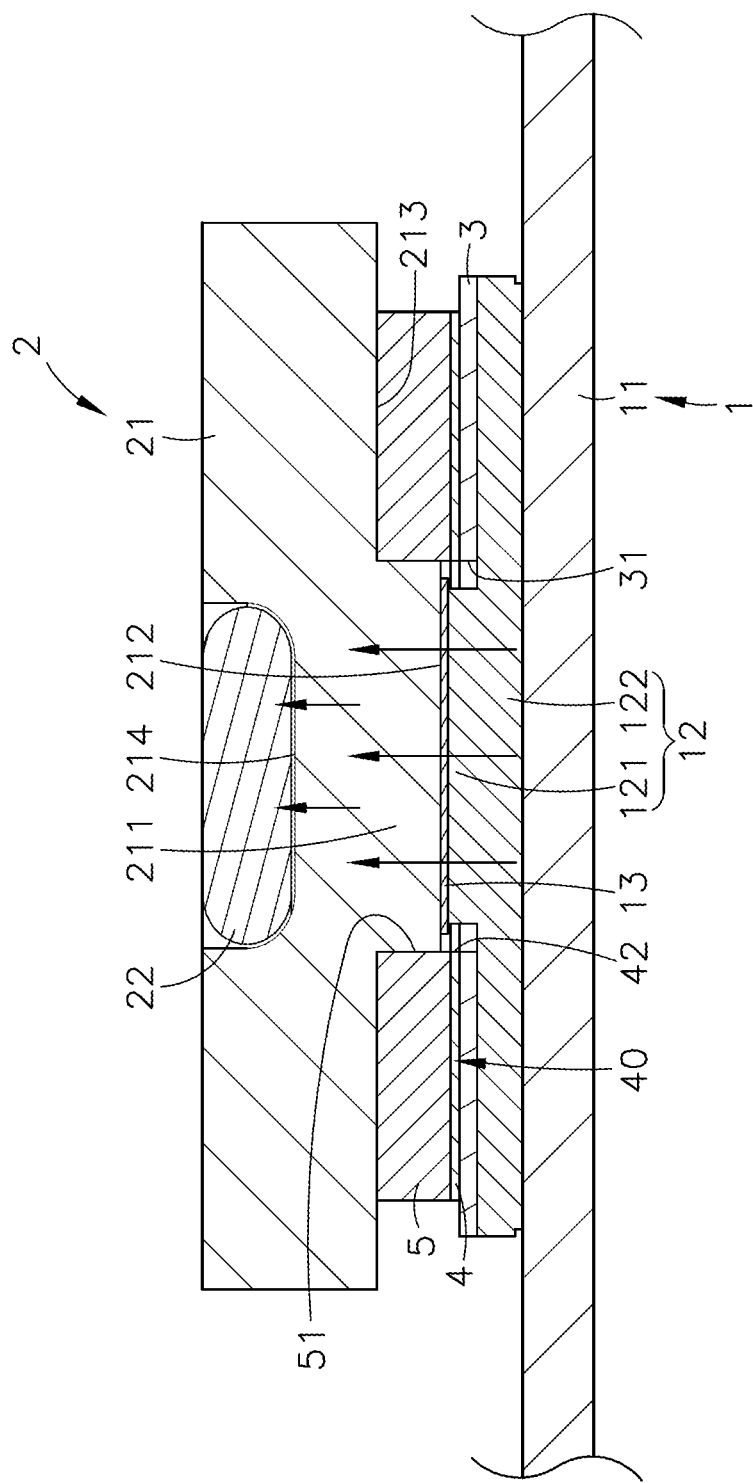
FIG. 6 is a schematic applied view of the first embodiment of the present invention, illustrating a heat dissipation status of the heating element and circuit module stack structure.

Referring to FIGS. 5 and 6, when temperature of the chip 121 of the chip unit 12 detected by the sensing circuit or temperature sensor means (not shown) of the circuit board 11 of the circuit module 1 or a predetermined extension card (not shown) is below 0° C., the power circuit or power supply device of the circuit module 1 is controlled to conduct electricity through the power lead wires 41 to the electric heating element 4, causing the heat generating area 40 to generate heat. The heat transfer layer 3 immediately and evenly transfers the heat energy generated by the heat generating area 40 to the carrier plate 122 of the chip unit 12 to heat the chip 121. When the temperature reaches the normal operating temperature range (for example, 0° C.~+75° C. of the chip 121) around the flat bottom block 211 and the temperature of the chip 121 detected by the sensing circuit or temperature sensor means of the circuit board 11 of the circuit module 1 surpasses 0° C., the circuit module 1 immediately cuts off power supply from the electric heating element 4. Subject to the application of the present invention, a computer system (desk computer, notebook, etc.) can be started up in a low temperature or cold outdoor environment, preventing computer shutdown due to a cold weather.

During operation of the heat generating area 40 of the electric heating element 4 to generate heat, the thermal insulation component 5 prevents the bottom wall 213 of the thermally conductive base member 21 of the heat sink 2 from absorbing the heat energy generated by the heat generating area 40, enabling the electric heating element 4 to heat the chip 121 of the chip unit 12 effectively. Further, the heating speed of the electric heating element 4 to heat the chip unit 12 through the heat transfer layer 3 is determined subject to the thermal conductivity and thickness of the heat transfer layer 3. Lowering the thermal resistance of the heat transfer layer 3 can relatively increase the chip heating speed and thermal power. The heating element and circuit module stack structure effectively solves the wrapping problem and the problem of limited temperature-maintaining effects of using heat insulating materials, and effectively eliminates the drawbacks of using a resistance heating circuit or wide temperature components that are complicated and expensive to manufacture and their installation can affect the circuit layout. The application of the heating element and circuit module stack structure facilitates spatial arrangement and achieves optimal chip unit heating effects.

During operation of the chip unit 12 of the circuit module 1, the flat bottom block 211 of the aluminum or copper thermally conductive base member 21 of the heat sink 2 absorbs generated waste heat from the chip unit 12 through the heat transfer medium 13 and transfers absorbed waste heat to the heat pipe 22 for quick dissipation through other heat sink or cooling means that is attached to the cold side of the heat pipe 22, maintaining the chip unit 12 of the circuit module 1 in the normal operating temperature range.

Further, the heat transfer layer 3, the electric heating element 4 and the thermal insulation component 5 can be configured to fit the design and arrangement of the chip 121 of the chip unit 12 and the flat bottom block 211 of the thermally conductive base member 21 without the aforesaid openings 31;42;51. Further, the number, shape and size of the heat transfer layer 3, the electric heating element 4 and the thermal insulation component 5 can be changed subject to different application requirements without departing from the spirit and scope of the present invention.

Figure 4:
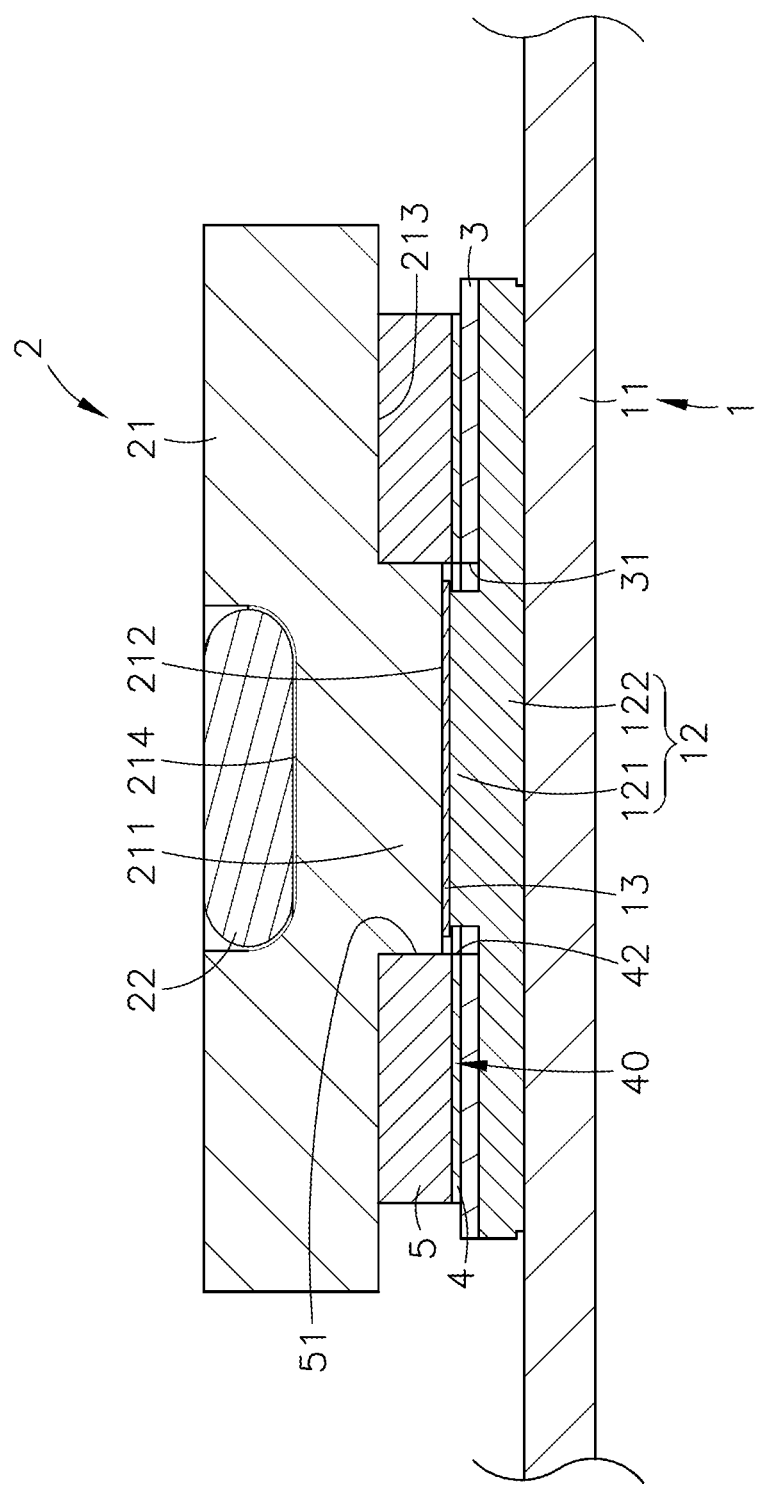
FIG. 4 is a sectional front view of the heating element and circuit module stack structure in accordance with the first embodiment of the present invention.
Figure 7:
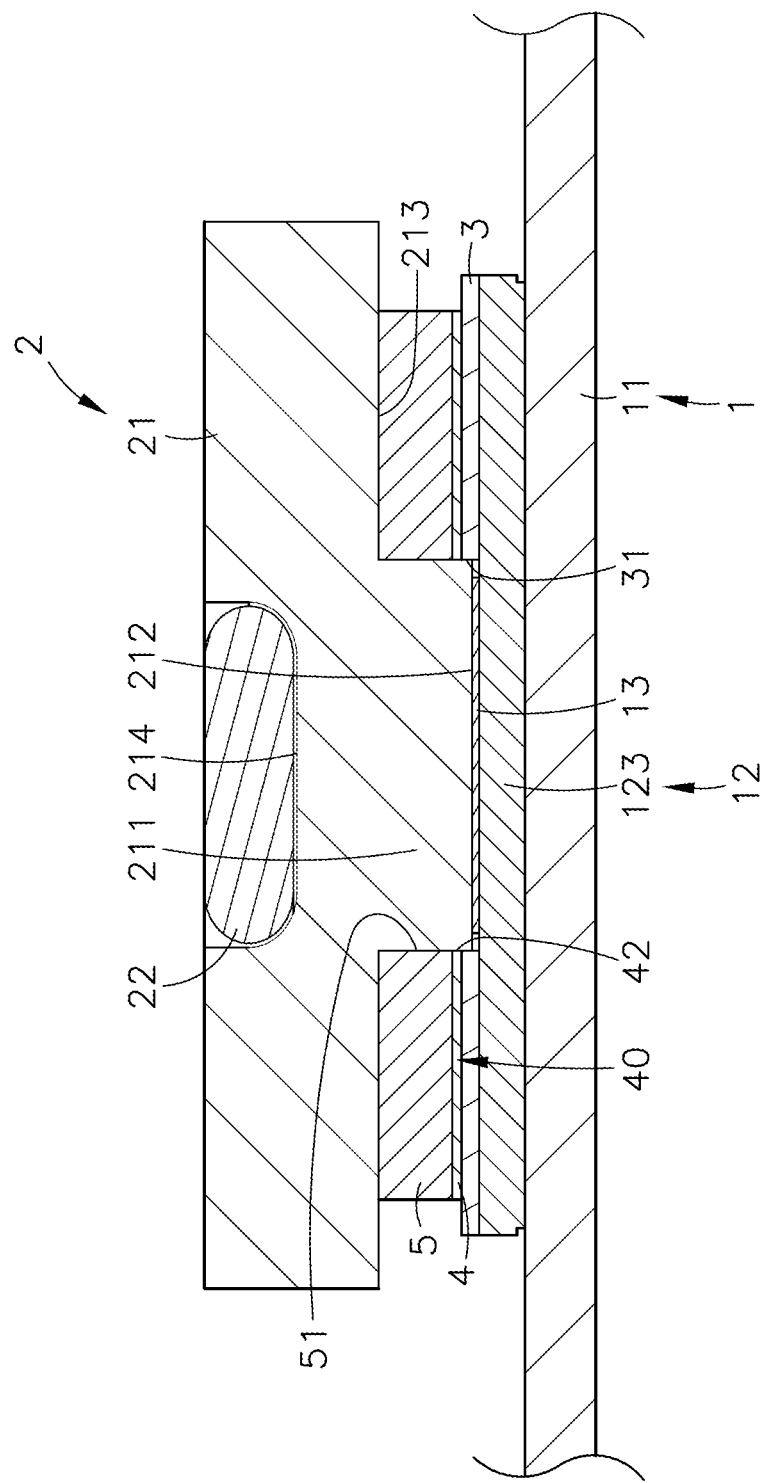
FIG. 7 is a sectional front view of a heating element and circuit module stack structure in accordance with a second embodiment of the present invention.
Figure 8:
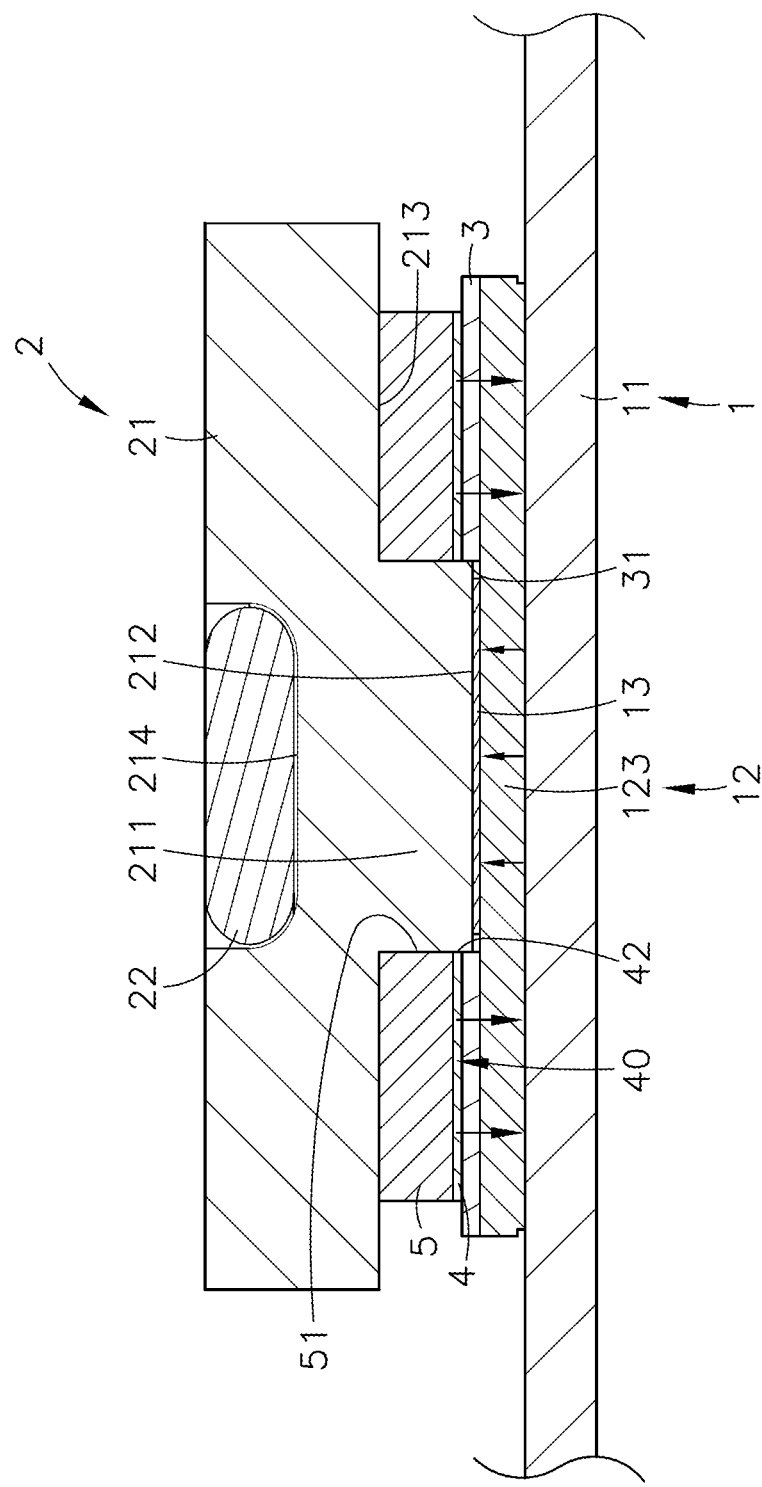
FIG. 8 is a schematic applied view of the second embodiment of the present invention, illustrating a heating operation status of the heating element and circuit module stack structure.

Referring to FIGS. 7, 8, and 4, a heating element and circuit module stack structure in accordance with a second embodiment of the present invention is shown. This second embodiment is substantially similar to the aforesaid first embodiment with the exception that the chip unit 12 of the circuit module 1 comprises a chipset 123, for example, PCH (Intel® Cougar Point-M Platform Controller Hub) chipset, GMCH (Graphics and Memory Controller Hub) chipset, ICH (I/O Controller Hub) chipset, SSD (Solid state drive) chipset, or NAND flash chipset. The planar bottom surface 212 of the flat bottom block 211 of the thermally conductive base member 21 and the heat transfer layer 3 are directly kept in close contact with the chipset 123 of the chip unit 12 of the circuit module 1. The chip unit 12 of the circuit module 1 in accordance with this second embodiment eliminates the aforesaid carrier plate 122. During operation of the electric heating element 4, the heat energy generated by the heat generating area 40 is transferred through the heat transfer layer 3 to the chipset 123 of the chip unit 12. Thus, the spatial arrangement of the heating element and circuit module stack structure can be changed subject to the design of the chip unit 12 of the circuit module 1, enhancing the heating speed and thermal power of the electric heating element 4 in heating the chipset 123.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A heating element and circuit module stack structure, comprising:
   a circuit module comprising a circuit board and a chip unit mounted on said circuit board;
   a heat sink comprising a thermally conductive base member, said thermally conductive base member having a flat bottom block protruded from a center area of a bottom wall thereof and kept in close contact with said chip unit of said circuit module;
   a heat transfer layer mounted in between said bottom wall of said thermally conductive base member of said heat sink and said chip unit of said circuit module around said flat bottom block;
   an electric heating element mounted in between said heat transfer layer and said bottom wall of said thermally conductive base member of said heat sink around said flat bottom block and adapted to heat said chip unit of said circuit module; and
   a thermal insulation component mounted in between said electric heating element and said bottom wall of said thermally conductive base member of said heat sink around said flat bottom block.

2. The heating element and circuit module stack structure as claimed in claim 1, wherein said chip unit of said circuit module comprises a carrier plate and a chip electrically bonded to said carrier plate; said flat bottom block of said thermally conductive base member of said heat sink defines a planar contact surface kept in close contact with said chip of said chip unit of said circuit module.

3. The heating element and circuit module stack structure as claimed in claim 2, wherein said circuit module further comprises a heat transfer medium set between said planar contact surface of said flat bottom block of said thermally conductive base member and said chip of said chip unit.

4. The heating element and circuit module stack structure as claimed in claim 2, wherein said chip unit of said circuit module is a CPU (Central Processing Unit).

5. The heating element and circuit module stack structure as claimed in claim 2, wherein said heat transfer layer is set between said bottom wall of said thermally conductive base member and said carrier plate of said chip unit of said circuit module.

6. The heating element and circuit module stack structure as claimed in claim 1, wherein said chip unit of said circuit module comprises a chipset; said flat bottom block of said thermally conductive base member of said heat sink defines a planar contact surface kept in close contact with said chipset of said chip unit of said circuit module.

7. The heating element and circuit module stack structure as claimed in claim 6, wherein said circuit module further comprises a heat transfer medium set between said planar contact surface of said flat bottom block of said thermally conductive base member and said chipset of said chip unit, said heat transfer medium being a thermal adhesive.

8. The heating element and circuit module stack structure as claimed in claim 6, wherein said chipset of said chip unit of said circuit module is selected from the group of PCH (Platform Controller Hub) chipset, GMCH (Graphics and Memory Controller Hub) chipset, ICH (I/O Controller Hub) chipset, SSD (Solid state drive) chipset and NAND flash chipset.

9. The heating element and circuit module stack structure as claimed in claim 6, wherein said heat transfer layer is set between said bottom wall of said thermally conductive base member and said chipset of said chip unit of said circuit module.

10. The heating element and circuit module stack structure as claimed in claim 1, wherein said heat sink further comprises a locating groove located at a top wall of said thermally conductive base member opposite to said thermal insulation component, and a heat pipe mounted in said locating groove.

11. The heating element and circuit module stack structure as claimed in claim 1, wherein said heat transfer layer is selected from the group of silicone rubber, rubber and ceramics.

12. The heating element and circuit module stack structure as claimed in claim 1, wherein said electric heating element comprises a heat generating area electrically conductible to generate heat, and a plurality of power lead wires electrically connecting said heat generating area to said circuit board of said circuit module.

13. The heating element and circuit module stack structure as claimed in claim 1, wherein said thermal insulation component comprises an opening; said flat bottom block of said thermally conductive base member of said heat sink is inserted through said opening of said thermal insulation component and kept in close contact with said chip unit of said circuit module.

14. The heating element and circuit module stack structure as claimed in claim 1, wherein said thermal insulation component is selected from the group of rubber, silicone rubber, polyethylene terephthalate, sponge, glass fire, carbon fiber, Mica sheet and aluminum oxide ceramic.

* * * * *